(12) United States Patent
Hezar et al.

(10) Patent No.: US 6,930,624 B2
(45) Date of Patent: Aug. 16, 2005

(54) CONTINUOUS TIME FOURTH ORDER DELTA SIGMA ANALOG-TO-DIGITAL CONVERTER

(75) Inventors: Rahmi Hezar, Plano, TX (US); Baher Haroun, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/699,585

(22) Filed: Oct. 31, 2003

(65) Prior Publication Data

US 2005/0116850 A1    Jun. 2, 2005

(51) Int. Cl.$^7$ .............................................. H03M 3/00
(52) U.S. Cl. ..................................................... 341/143
(58) Field of Search ........................................ 341/143

(56) References Cited

U.S. PATENT DOCUMENTS

| | | | |
|---|---|---|---|
| 5,103,228 A | | 4/1992 | Voorman et al. |
| 5,227,795 A | * | 7/1993 | Yamakido et al. .......... 341/166 |
| 5,305,004 A | | 4/1994 | Fattaruso |
| 6,275,177 B1 | | 8/2001 | Ho et al. |

OTHER PUBLICATIONS

White et al., Integrated fourth-order Sigma-Delta convertor with stable self-suning continuous time noise shaper, IEE Proceedings on Circuit, Devices & Systems, vol. 141, No. 3 Jun. 1994, pp. 145-150.*

Schreier et al., Delta-Sigma Modulators Employing Continuous-Time Circuitry, IEEE Transactions on Circuits and Systems-I: Fundamental Theory and Applications, vol. 43, No. 4, Apr. 1996, pp. 324-332.*

Benabes et al. Passive Sigma-Delta converters design, IEEE Instrumentation and Measuremnt Technology Conference, May 21-23, 2002, pp. 469-474.*

Institute of Electrical and Electronics Engineers, 2002 Digest of Technical Papers and Visuals Supplement 2002 to the Digest of Technical Papers, IEEE International Solid-State Circuits conference, vol. Forty-Five, ISSN 0193-6530, 13.3 "A Dual-Mode 80MHz Bandpass ΔΣ Modulator for a GSM/WCDMA IF-Receiver" T. Salo, T. Hollman, S. Lingfors and K. Halonen, 7 pgs.

* cited by examiner

*Primary Examiner*—Howard L. Williams
(74) *Attorney, Agent, or Firm*—Frederick J. Telecky, Jr.; W. James Brady, III

(57) ABSTRACT

A fourth order delta sigma analog-to-digital converter is presented, comprising a passive delta sigma modulator including a passive filter, a quantizer, and a digital-to-analog converter in a first feedback loop, and an active filter having a large gain factor in a second feedback loop around the passive delta-sigma modulator.

23 Claims, 6 Drawing Sheets

CONTINUOUS TIME FOURTH ORDER DELTA SIGMA ANALOG-TO-DIGITAL CONVERTER

FIELD OF INVENTION

The present invention relates generally to integrated circuit devices and more particularly to continuous time delta sigma analog-to-digital data converters.

BACKGROUND OF THE INVENTION

Analog-to-digital (A/D) converters are electrical circuit devices that convert continuous signals, such as voltages or currents, from the analog domain to the digital domain, in which the signals are represented by numbers. A variety of A/D converter types exist, including flash A/Ds, sub-ranging A/Ds, successive approximation A/Ds, and integrating A/Ds. Another type is known as a sigma delta or delta sigma (e.g., $\Delta$-$\Sigma$) A/D converter, which includes a delta sigma modulator that samples an analog signal at a very high sampling rate (oversampling) in order to perform a noise shaping function. The oversampling is commonly performed at a multiple of the Nyquist rate ($F_N$) for a given input signal frequency content (e.g., sampling frequency $F_S$ is 10 to 1000 times $F_N$), wherein quantization noise power is spread over a bandwidth equal to the sampling frequency, thereby reducing the noise density in the band of interest. Digital filtering is then employed on the digital output to achieve a high resolution. Decimation may then be employed to reduce the effective sampling rate back to the "Nyquist" rate. Delta sigma data converters also typically include a loop filter in the forward signal path that operates to push some of the quantization noise into the higher frequency spectrum beyond the band of interest.

Referring to FIG. 1, a typical delta sigma converter 10 include a loop filter 12, a single or multi-bit quantizer 14, and a digital-do-analog (D/A) feedback converter 16 in a closed loop forming a delta sigma modulator. The loop filter 12 may be first order, second order, or jth order (e.g., where j is a positive integer), and is generally an integrator circuit (e.g., low pass filter) that filters the difference between the analog input signal X(t) and a feedback signal from the D/A feedback converter 16. The quantizer 14 includes a sample and hold (S/H) circuit 18 and a comparator 20, which convert the filtered analog signal to a digital output Y(n), and the feedback D/A converter 16 converts the quantized digital output Y(n) to analog form, which is provided as the feedback signal to the filter 12. The quantized output Y(n) is oversampled, including a series of ones and zeros where the mean of all the data points Y(n) is representative of the analog input signal X(t). The output Y(n) is fed to a digital filter and decimation system 22 that reduces the bandwidth by averaging the samples Y(n) (e.g., low pass filter). Because the bandwidth is reduced by the digital output filter 22, the output data rate may be reduced below the original sampling rate $F_S$ through decimation (e.g., passing every $m^{th}$ result and discarding the rest), while still satisfying the Nyquist criterion.

In conventional active delta sigma converters, the filter 12 is typically constructed using switching components, such as switched capacitor circuits. However, many modern CMOS fabrication processes suffer from capacitor leakage that limits the performance of active delta sigma converters that have signal path switching components. Passive delta sigma converters have been proposed, in which the loop filter is constructed without switched capacitor circuits or amplifiers, such that leakage issues are avoided, even with modern CMOS fabrication processes. However, passive delta sigma converters are generally restricted to first or second order filters, wherein higher order filtering lengthens the loop delay, resulting in instability. In addition, the input referred noise of the comparator 20 in conventional passive delta sigma converters is not shaped by the filter 12, resulting in degraded performance. Thus, while passive delta sigma converters avoid leakage problems in certain modern CMOS fabrication processes, improved data conversion systems are needed by which the advantages of delta sigma modulation can be realized without sacrificing performance.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The invention relates to delta sigma data conversion systems in which a passive delta sigma modulator is combined with an active filter in a feedback loop around the passive delta sigma modulator to reduce the adverse effects of quantizer noise, while avoiding leakage problems associated with forward signal path switching components (e.g., switched capacitor networks, etc.).

One aspect of the invention provides an analog-to-digital converter, comprising a passive delta sigma modulator including a passive filter, a quantizer, and a digital-to-analog converter in a first feedback loop, as well as an amplifier in an outer feedback loop around the passive delta-sigma modulator. The amplifier may have a high gain to reduce noise associated with the quantizer, and a second filter may be provided in the outer loop, for example, where the amplifier is part of an active filter in the feedback loop around the passive converter. In one example, the passive filter and the second filter are second order low pass filters with no switching components, where the poles and zeros of the two filters may be matched. In this implementation, fourth order passive delta sigma conversion is provided without the stability limitations of conventional passive delta sigma converters, while still providing low power operation without leakage issues found in conventional active modulator designs. The invention may be implemented in other configurations, for instance, wherein the poles and zeros of the two filters may be of any value, and need not be matched. Another aspect of the invention provides analog-to-digital conversion systems, comprising a passive delta sigma converter stage and an active gain stage. The passive delta sigma converter stage comprises a first filter, a quantizer, and a first D/A converter. The first filter is free of switching components and provides a first filtered analog signal according to a converter stage analog input and a feedback signal from the first D/A. The quantizer provides a quantized output according to the first filtered analog signal, and the first D/A converter provides the first analog feedback signal according to the quantized output. The active gain stage receives a system analog input and provides the converter stage analog input according to the system input and the quantized output.

In one implementation, the active gain stage comprises a second filter, a second D/A converter, and an amplifier, where the second filter is also free of switching components (e.g., formed using R-C networks). The second filter receives the system analog input and a second analog feedback signal, and the second D/A provides a second analog feedback signal according to the quantized output. The amplifier is coupled with the second filter, wherein the amplifier and the second filter provide the converter stage analog input according to a difference between the system analog input and the second analog feedback signal scaled by a gain factor, which can be greater than 25, such as about 100 in one example.

Another aspect of the invention provides a data converter system, comprising a passive circuit with a quantizer and a passive filter, as well as an active circuit and a feedback circuit. The passive circuit comprises a quantizer in a forward signal path that provides a quantized output representative of a quantizer input signal, and a passive filter coupled with the quantizer in the forward signal path that is free of switching components. The passive filter provides an input to the quantizer according to a converter input and a first feedback signal. The active circuit includes an active filter in the forward signal path, the active filter being free of switching components and providing the converter input according to a difference between a system analog input and a second feedback signal and according to a gain factor. The feedback circuit provides the first and second feedback signals according to the quantized output.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
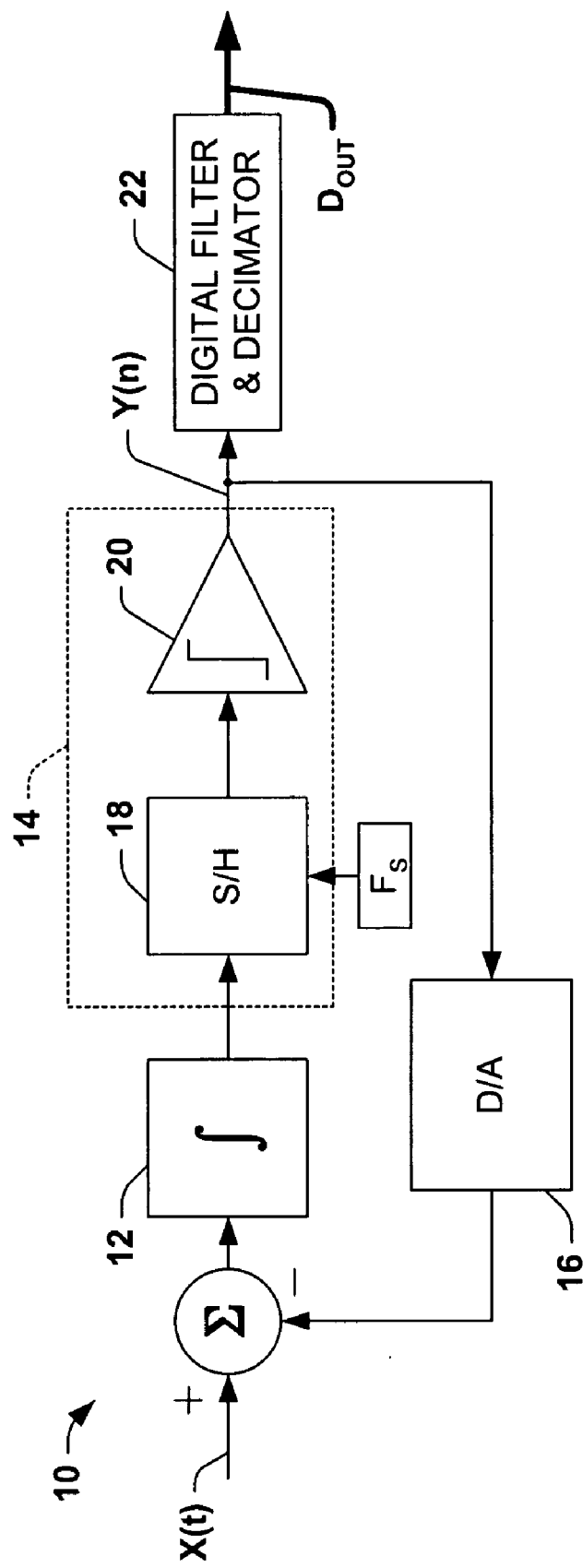
FIG. 1 is a simplified schematic diagram illustrating a single stage delta sigma analog-to-digital converter.

One or more exemplary implementations of the present invention will now be described with reference to the attached drawings, wherein like reference numerals are used to refer to like elements throughout. The various aspects of the invention are illustrated below in an exemplary data converter employing a passive delta sigma modulator, with a high gain active filter provided in an outer feedback loop around the passive modulator to provide analog-to-digital data conversion. While illustrated and described hereinafter in the context of an exemplary fourth order analog to digital conversion system 50 with a given set of filter pole and zero locations, the invention is not limited to the the specific pole/zreo locations of the system 50, wherein data converters having any pole/zero locations are contemplated as falling within the scope of the invention and the appended claims. Furthermore, conversion systems may be of any order within the scope of the invention, for example, including systems of higher than fourth order, where the stability of such systems may be controlled by selection of suitable pole and zero locations. In addition, while the exemplary system 50 is illustrated and described below in operation at a given sampling frequency, any suitable sampling frequency may be used in a system within the scope of the invention.

Figure 2:
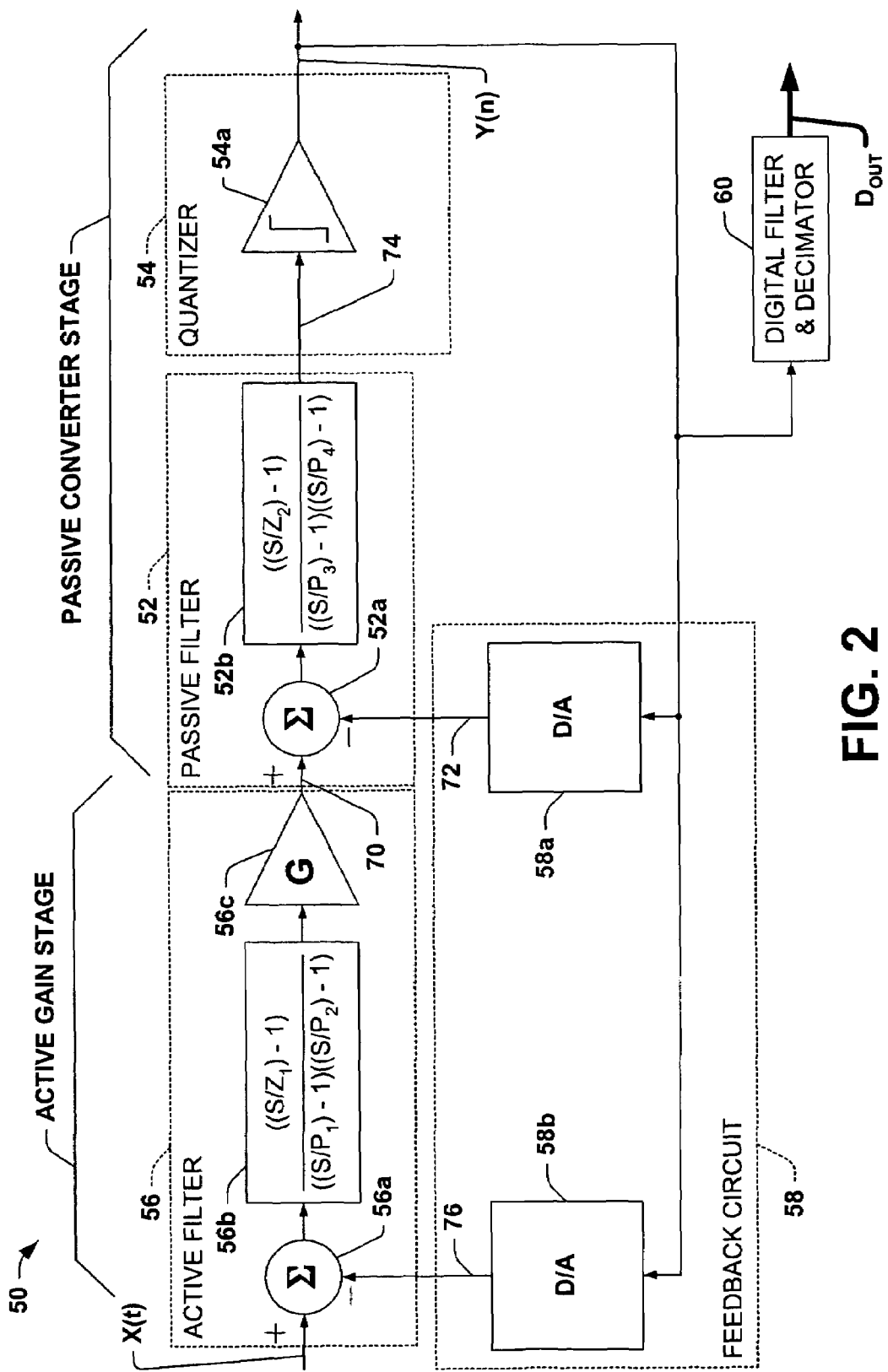
FIG. 2 is a schematic diagram illustrating an exemplary fourth order delta sigma analog-to-digital converter having a passive converter stage and an active gain stage in an outer feedback loop around the passive converter in accordance with the present invention.
Figure 3:
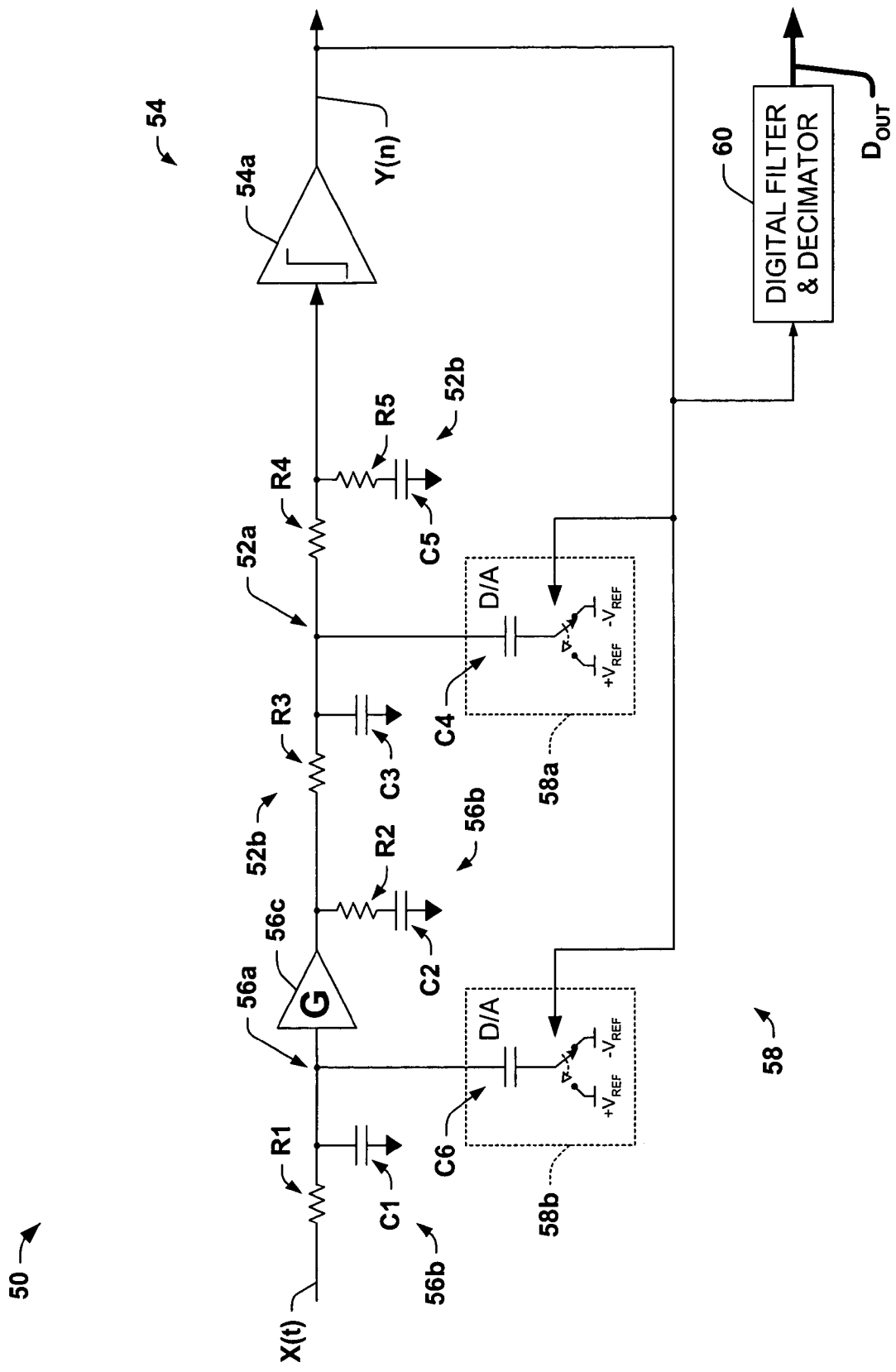
FIG. 3 is a schematic diagram further illustrating the exemplary fourth order delta sigma converter of FIG. 2.

Referring to FIGS. 2 and 3, an exemplary delta sigma analog to digital conversion system 50 is illustrated, comprising a passive filter 52 and a quantizer 54 in a forward signal path of a passive delta sigma converter stage or circuit. The system 50 further comprises an active filter 56 in an active feedback gain stage or circuit along the forward signal path, and a feedback circuit 58 in a feedback signal path, including first and second switched capacitor digital-to-analog (D/A) converters 58a and 58b. FIG. 3 illustrates an exemplary single-ended implementation of the converter system 50, although differential implementations are also contemplated within the scope of the invention. The system 50 receives a system analog input X(t) for conversion, and the quantizer 54 provides a quantized output Y(n) to the feedback circuit 58 and to a digital filter and decimation system 60, which in turn generates a digital output $D_{OUT}$ representative of the analog system input X(t). Any suitable hardware circuitry or software systems may be employed to create the digital filter and decimator system 60 within the scope of the invention. The quantizer 54 provides a single-bit quantized output Y(n) using a comparator 54a.

The passive filter 52 includes a summing junction or node 52a and a first low pass filter 52b of second order, with two poles $P_3$ and $P_4$, as well as a zero $Z_2$, wherein the first filter 52b is free of switching components. As illustrated in FIG. 3, the filter 52b is implemented without switching components, wherein the pole $P_3$ is set by the values of resistor R3 and capacitor C3, the pole $P_4$ is set by the values of resistors R4 and R5, and capacitor C5, and the zero $Z_2$ is set by the values of resistor R5 and capacitor C5. The first D/A converter 58a is implemented in the feedback path using transistors or other switching devices to selectively couple a feedback capacitor C4 with either a positive reference voltage +Vref or a negative reference voltage –Vref.

The active filter 56 comprises a summing junction 56a and a second low pass filter 56b, also free of switching components, as well as an amplifier 56c, such as an operational amplifier or other amplifier circuit. While the amplifier 56c is illustrated in FIGS. 2 and 3 as a single component, any amplifier may be employed in accordance with the invention, which uses no switching components in the forward signal path of the converter system 50. The amplifier 56c, moreover, may include multiple components, for example, an operational amplifier with resistances in a feedback loop (not shown) to set the amplifier gain factor. Furthermore, the second filter 56b in the outer feedback loop may, but need not, be designed with poles and zero(s) corresponding to those of the first filter 52b, wherein the amplifier 56c may be combined with the filter 56b in an active filter configuration that is free of switching components, as in the exemplary implementation of FIG. 3, within the scope of the invention. The second filter 56b is implemented without switching components, having two poles $P_1$ and $P_2$, as well as a zero $Z_1$, as illustrated in FIG. 3. The pole $P_1$ is set by the values of resistor R1 and capacitor C1, pole $P_2$ is set by the values of resistor R2, the output impedance of the amplifier 56c and the capacitor C2, and the zero $Z_2$ is set by the values of resistor R2 and capacitor C2. The D/A converter 58b is implemented in the feedback path using transistors or other switching devices to selectively couple a feedback capacitor C6 with either +Vref or −Vref.

The forward signal path of the system 50 thus includes no switching components, wherein capacitor leakage problems of conventional active delta sigma converters are mitigated or avoided. In addition, the system provides fourth order noise shaping without the instability associated with conventional higher order passive delta sigma converters, by virtue of the first and second filters 52b and 56b, each of which is a second order low pass filter (e.g., integrator) in the exemplary system 50. Moreover, any input noise associated with the input of the quantizer 54 is reduced by the gain factor of the amplifier 56c. Thus, the system 50 provides the advantages of passive delta sigma modulation, without the noise and stability performance limitations thereof, and may be easily implemented using modern CMOS fabrication processes.

In operation, the first filter 52 receives a converter stage analog input 70 and a first analog feedback signal 72 at the summing circuit 52a, and provides a first filtered analog signal 74 as an input signal to the quantizer 54 according to the difference between the converter stage input 70 and the first feedback signal 72. The quantizer 54 provides the quantized output Y(n) according to the first filtered analog signal 74, and the first D/A 58a provides the first analog feedback signal 72 according to the quantized output Y(n). The active filter 56 in the gain stage receives the system input X(t) and provides the converter stage analog input 70 via the second filter 56b and the amplifier 56c according to the difference between the system input X(t) and a second feedback signal 76 from the second D/A 58b scaled by the gain factor of the amplifier 56c.

In the system 50, the amplifier 56c preferably has a high gain*bandwidth product, wherein the gain of the active filter 56 and the bandwidth of the filter poles are set according to the amplifier gain*bandwidth product and the desired frequency band for a given application. In the illustrated example, the poles and zeroes of the filters 52b and 56b generally correspond with one another, although strict pole and zero matching are not required within the scope of the invention. Further, the illustrated filters 52c and 56c are both second order low pass filters, although filters of other orders and other types (e.g., bandpass), may be used in accordance with the invention.

Any noise associated with the input of the quantizer 54 is reduced by the gain factor of the amplifier 56c. This is an improvement over conventional passive delta sigma designs, in which the quantizer input noise was not noise shaped. Thus, the gain of the amplifier 56c in the system 50 is preferably high, such as greater than about 25, for example, about 100 in one implementation. In addition, the converter 50 may be adapted for use in a variety of applications across a wide bandwidth range, wherein the gain and pole/zero locations in the system 50 can be selected for operation in cellular communications devices compatible with GSM (Global System for Mobile Communications) having bandwidths of a few hundred kHz up to video or GPS devices using bandwidths of up to 5 MHz or more.

Figure 4:
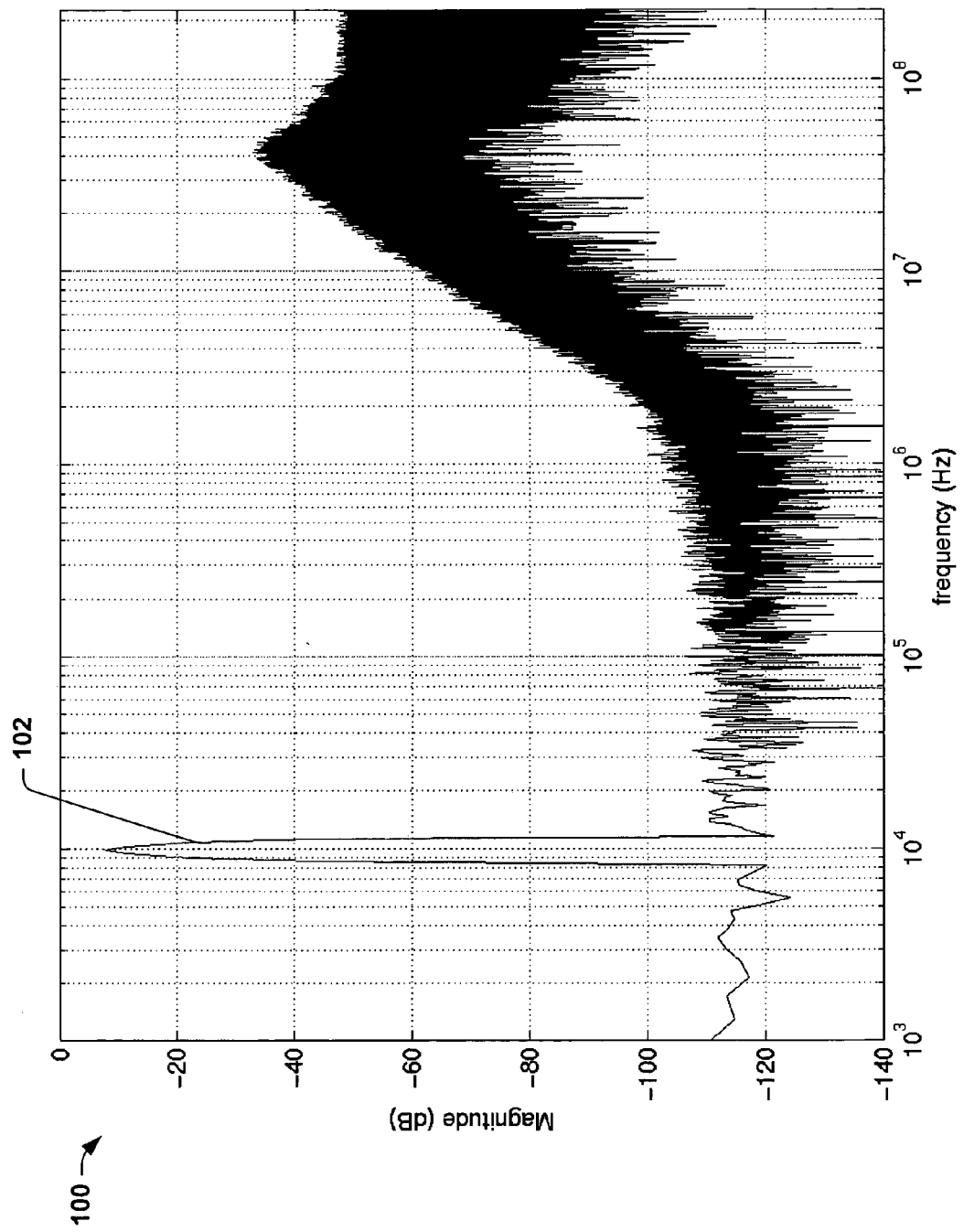
FIGS. 4 and 5 are frequency response plots illustrating single tone and dual tone simulation results for a fourth order delta sigma analog-to-digital converter in accordance with the invention.
Figure 5:
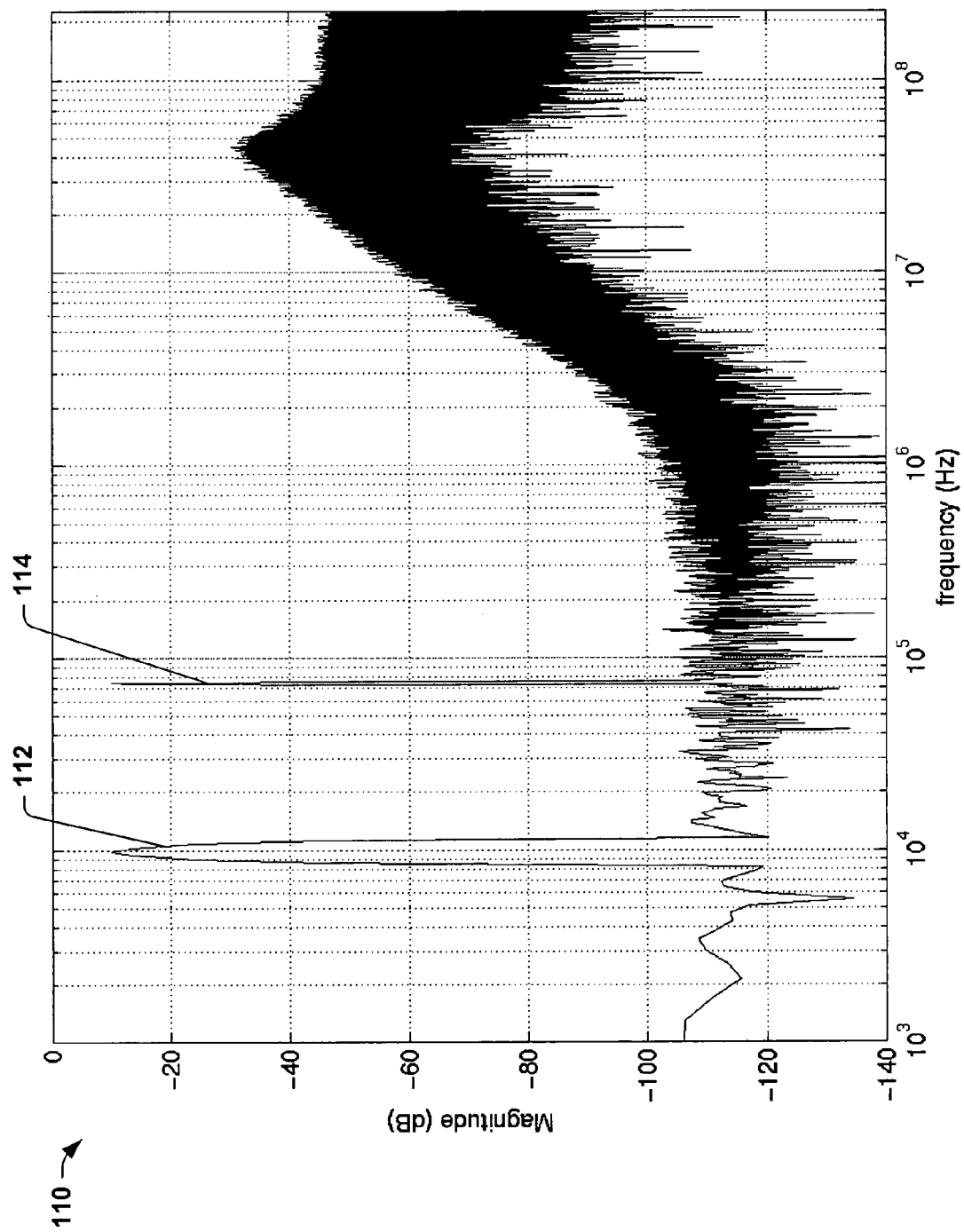

FIGS. 4 and 5 illustrate frequency response plots 100 and 110 showing single tone and dual tone simulation results, respectively, for the exemplary fourth order delta sigma analog-to-digital converter 50 in accordance with the invention. In these simulations, the single and dual tone frequencies Fin were set to 9.87 kHz and 74.2 kHz, the quantizer 54 was simulated with a sample/hold (not shown) operating at a sampling frequency of about 450 MHz, with third harmonic and reference voltage coupling being simulated at −60 and −80 dB, respectively. In addition, comparator input noise was simulated at 100 nV/Hz, amplifier noise was simulated at 25 nV/Hz, and amplifier saturation was set to +/− 2 V for an amplifier gain*bandwidth product of about 100*800 kHz with a simulation gain factor of about 100. The filter pole $P_1$ was set to 800 KHz, poles $P_2$ and $P_4$ were set to 1.6 MHz, pole $P_3$ was set to 250 MHz, and the zeros $Z_1$ and $Z_2$ were set to 5.0 MHz via selection of the component values for the R-C circuits in the filters 52b and 56b. In FIG. 4, a peak 102 is seen for the single tone at 9.87 kHz, with a noise floor at about −110 dB. For the dual tone example of FIG. 5, response peaks 112 and 114 are seen for the tones at 9.87 kHz and 74.2 kHz, respectively, again with a noise floor at about −110 dB through about 1 MHz.

The following Table 1 illustrates comparative simulation results for the exemplary delta sigma A/D conversion system 50 for different pole/zero selections and frequency bands (columns 2–4), as well as results for conventional passive delta-sigma implementations (columns 5 and 6 with and without noise). The response plots 100 and 110 in FIGS. 4 and 5 correspond to the pole and zero selections of column 4 in Table 1, in which acceptable performance results are obtained for all the listed frequency bands. In this regard, the first three frequency bands correspond to GSM standard, the Bluetooth CDMA standard corresponds to the 600 kHz and 1.0 MHz bands, wideband CDMA (WCDMA) corresponds to the 2.0 and 3.0 MHz bands, Bluetooth corresponds to the 3.0 MHz band, and video standards generally correspond to the 5.0 MHz band in Table 1. As seen in the fourth column, the invention allows the poles to be increased to accommodate higher frequency bands (e.g., poles at 800 kHz and 1.6 MHz in column 4), while still achieving acceptable performance for GSM and other narrow band applications. Thus, the invention allows robust designs applicable in GSM as well as wideband data conversion applications.

TABLE 1

| Frequency Band (kHz) | $P_1$ = 200 kHz $P_2$ = 400 kHz Z = 5.0 MHz | $P_1$ = 400 kHz $P_2$ = 800 kHz Z = 5.0 MHz | $P_1$ = 800 kHz $P_2$ = 1.6 MHz Z = 5.0 MHz | Conventional Passive DSM (no noise) | Conventional Passive DSM (noise + distortion) |
|---|---|---|---|---|---|
| 100 | 95.7 dB | 95.4 dB | 92.9 dB | 84.9 dB | 71.2 dB |
| 200 | 93.6 dB | 93.2 dB | 90.3 dB | 81.2 dB | 70.0 dB |
| 300 | 92.2 dB | 91.2 dB | 88.5 dB | 75.1 dB | 68.6 dB |
| 600 | 86.3 dB | 88.7 dB | 85.2 dB | 65.4 dB | 60.2 dB |
| 1000 | 70.2 dB | 83.3 dB | 82.9 dB | 54.2 dB | 48.3 dB |

TABLE 1-continued

| Frequency Band (kHz) | $P_1$ = 200 kHz $P_2$ = 400 kHz Z = 5.0 MHz | $P_1$ = 400 kHz $P_2$ = 800 kHz Z = 5.0 MHz | $P_1$ = 800 kHz $P_2$ = 1.6 MHz Z = 5.0 MHz | Conventional Passive DSM (no noise) | Conventional Passive DSM (noise + distortion) |
|---|---|---|---|---|---|
| 2000 | 42.1 dB | 61.1 dB | 75.8 dB | 33.0 dB | 31.1 dB |
| 2500 | 34.5 dB | 55.4 dB | 69.9 dB | 28.2 dB | 27.2 dB |
| 3000 | 30.2 dB | 48.7 dB | 64.8 dB | 25.1 dB | 24.3 dB |
| 5000 | 20.6 dB | 31.8 dB | 47.4 dB | 21.6 dB | 19.9 dB |

The following Table 2 illustrates comparative simulation results in dB for the exemplary system 50 for different amplifier and comparator noise levels for different frequency bands for a single 0.5 V peak-to-peak tone at 9.87 kHz, wherein third harmonic and reference voltage coupling were again set to −60 and −80 dB, respectively. In Table 2, the filter poles and zeros were set as in the above example (e.g., column 4 of Table 1), with an amplifier gain of about 100, where AN is the rms value of total amplifier noise and CN is the rms value of total comparator input noise in units of nV/(Hz)$^{-2}$.

TABLE 2

| Frequency Band (kHz) | AN = 0 CN = 0 | AN = 23.5 CN = 94.5 | AN = 23.5 CN = 189 | AN = 23.5 CN = 378 | AN = 47 CN = 94.5 | AN = 94 CN = 94.5 | AN = 188 CN = 94.5 |
|---|---|---|---|---|---|---|---|
| 100 | 102 | 92.96 | 85.39 | 82.23 | 86.36 | 81.08 | 75.47 |
| 200 | 99.61 | 90.31 | 93.75 | 79.38 | 83.93 | 78.41 | 72.69 |
| 300 | 97.62 | 88.47 | 81.85 | 77.48 | 82.18 | 76.73 | 70.93 |
| 600 | 93.61 | 85.21 | 78.71 | 73.88 | 78.92 | 73.41 | 67.58 |
| 1000 | 88.34 | 82.88 | 76.31 | 70.63 | 76.59 | 71.28 | 65.42 |
| 2000 | 77.12 | 75.82 | 68.40 | 61.84 | 71.53 | 67.71 | 62.28 |
| 2500 | 71.03 | 69.98 | 63.69 | 57.11 | 67.69 | 65.23 | 60.86 |
| 3000 | 65.21 | 64.81 | 59.26 | 53.60 | 63.13 | 62.11 | 59.08 |
| 5000 | 48.05 | 47.43 | 44.75 | 40.73 | 47.35 | 47.34 | 47.09 |

With respect to noise effects, the converter 50 is more tolerant of quantizer input noise than conventional passive delta sigma designs, since the quantizer noise is reduced by the amplifier gain and the system 50 provides fourth order noise shaping. The invention also provides better signal to noise plus distortion ratio (SNDR) via fourth order noise shaping without conventional passive delta sigma instability, and thus can accommodate higher frequency bands. In addition, the continuous time fourth order noise shaping prior to the sampling in the quantizer reduces the adverse effects of out-of-band noise (e.g., blockers and interferers). Furthermore, since there are no switching components in the signal path, low power implementations are possible in modern CMOS process flows without the leakage concerns of conventional active delta sigma converters.

Figure 6:
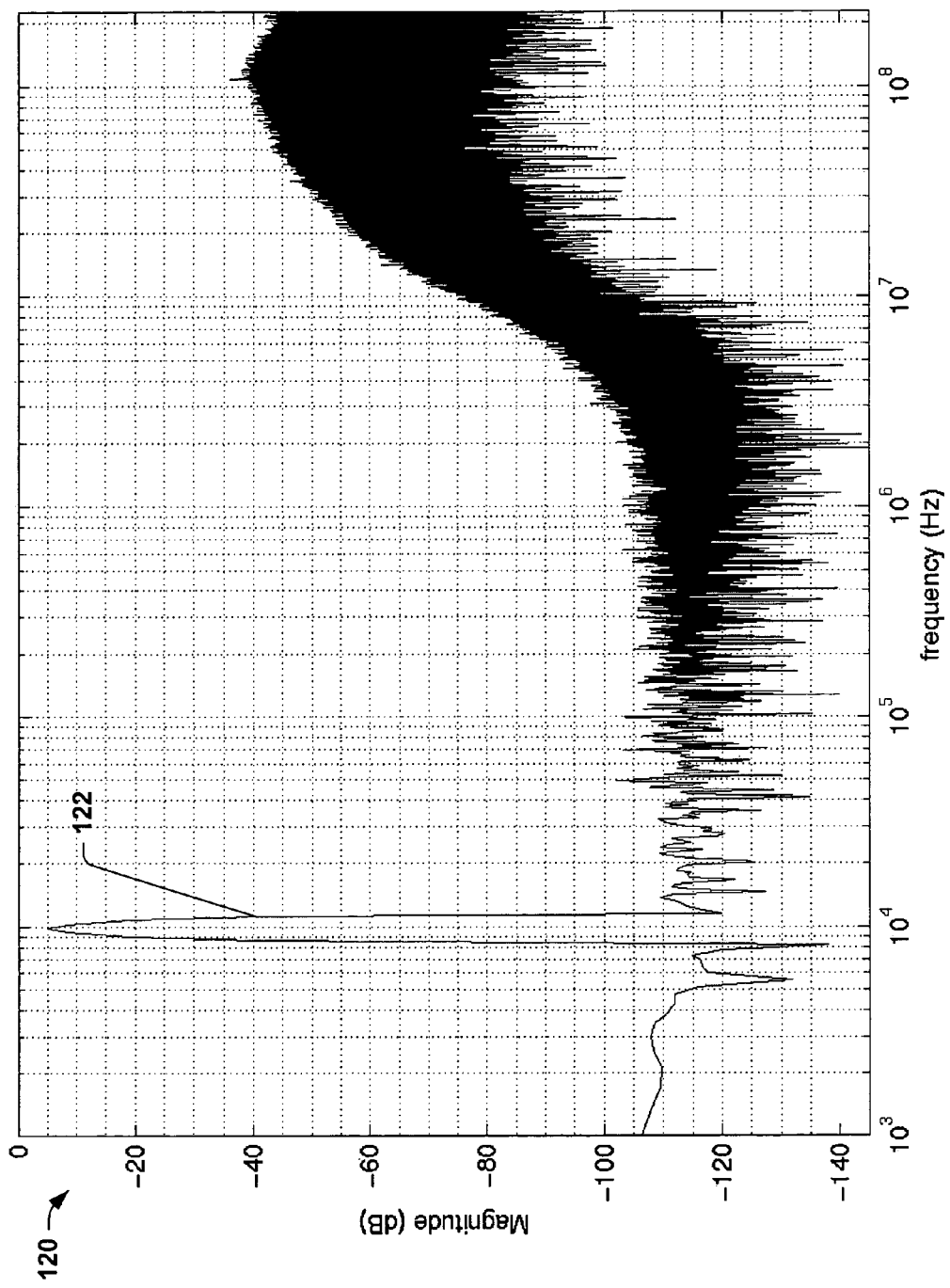
FIG. 6 is a frequency response plot illustrating single tone simulation results for another exemplary fourth order delta sigma analog-to-digital converter with higher pole and zero frequencies and lower amplifier gain in accordance with the invention.

Referring also to FIG. 6, the poles and zeros can be further adjusted to optimize performance at higher frequencies (e.g., wideband audio or video applications), and the amplifier gain can be reduced, for example, to about 25 or more in one implementation. A frequency response plot 120 in FIG. 6 shows the converter performance for a single tone frequency Fin of 9.87 kHz with an amplifier gain of 25 and a sampling frequency of 450 MHz, in which the third harmonic and reference voltage coupling were again simulated at −60 and −80 dB, respectively. Comparator input noise was simulated at 100 nV/Hz, amplifier noise was simulated at 25 nV/Hz, and amplifier saturation was set to +/−2 V. The filter poles $P_1$ and $P_3$ were set to 250 MHz, poles $P_2$ and $P_4$ were set to 4 MHz, and the zeros $Z_1$ and $Z_2$ were set to 40 MHz and 80 MHz, respectively, via component value selection for the filters 52b and 56b. A peak 122 is seen at 9.87 kHz, with the noise floor being slightly higher than in the previous examples of FIGS. 4 and 5, where the noise floor now extends out beyond about 2 MHz. The following Table 3 illustrates comparative simulation results in dB for wideband operation of the converter system 50 using the pole, zero, and gain factor settings from the above example (e.g., column 2 in Table 3) and the example simulated in FIG. 6 (e.g., column 3 in Table 3).

TABLE 3

| Frequency Band (kHz) | Poles at 800 kHz, 1.6 MHz Zeros at 5 MHz Gain factor = 100 | Poles at 4 MHz Zeros at 40 and 80 MHz Gain factor = 25 |
|---|---|---|
| 100 | 92.9 | 85.77 |
| 200 | 90.3 | 83.36 |
| 300 | 88.5 | 81.77 |
| 600 | 85.2 | 78.67 |
| 1000 | 82.9 | 76.43 |
| 2000 | 75.8 | 73.14 |
| 2500 | 69.9 | 71.65 |
| 3000 | 64.8 | 70.38 |
| 5000 | 47.4 | 64.51 |

As can be seen in Table 3. the increase of the and zero pole frequencies in the results of column 3 shows improved noise shaping well above 50 dB specifications for wideband applications such as video, while still providing better than 80 dB performance for 100 kHz GSM conversions or other narrowband applications. In addition, the increase in the pole and zero frequencies allows implementation of the filter resistors and capacitors in a smaller total area. Operation in higher bands is also possible, through appropriate selection of filter components, sampling frequency, amplifier gain, etc., for example, in GPS or other high frequency applications in frequency bands above 5 MHz.

In more narrowband applications, the sampling frequency $F_S$ may be decreased, wherein the simulated sample frequency of 450 MHz is merely one possible value used in the illustrated examples. In other implementations, the sampling rate could be decreased, for example, to 100 MHz, wherein the poles and zeros may also be reduced in GSM or other narrowband applications of the conversion system 50, while the amplifier gain is increased to further inhibit comparator noise degradation. The invention thus provides an amplification in an outer loop in the forward signal path of the passive delta sigma modulator with no switching components, and accordingly, no leakage issues, together with higher order noise shaping capability. This results in better performance and stability than conventional passive delta sigma data converter designs, since the converter noise has been shaped by the outer loop gain and filter, without adding forward signal path switching components.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. An analog-to-digital converter system, comprising:
   a passive delta sigma converter stage comprising:
   a first filter receiving a converter stage analog input and a first analog feedback signal, the first filter being free of switching components and providing a first filtered analog signal according to the converter stage analog input and according to the first analog feedback signal,
   a quantizer coupled with the first filter, the quantizer providing a quantized output according to the first filtered analog signal, and
   a first digital-to-analog converter coupled with the first filter and with the quantizer, the first digital-to-analog converter providing the first analog feedback signal according to the quantized output; and
   an active gain stage coupled with the passive delta sigma converter stage, the active gain stage receiving a system analog input and providing the converter stage analog input according to the system analog input and the quantized output, wherein the active gain stage comprises:
   a second filter receiving the system analog input and a second analog feedback signal, the second filter being free of switching components;
   a second digital-to-analog converter coupled with the second filter and with the quantizer, the second digital-to-analog converter providing the second analog feedback signal according to the quantized output; and
   an amplifier coupled with the second filter;
   wherein the amplifier and the second filter provide the converter stage analog input according to a difference between the system analog input and the second analog feedback signal scaled by a gain factor, wherein the gain factor is about 25 or more.

2. The system of claim 1, wherein the gain factor is about 100.

3. The system of claim 1, wherein the second filter is a second order low pass filter.

4. An analog-to-digital converter system, comprising:
   a passive delta sigma converter stage comprising:
   a first filter receiving a converter stage analog input and a first analog feedback signal, the first filter being free of switching components and providing a first filtered analog signal according to the converter stage analog input and according to the first analog feedback signal,
   a quantizer coupled with the first filter, the quantizer providing a quantized output according to the first filtered analog signal, and
   a first digital-to-analog converter coupled with the first filter and with the quantizer, the first digital-to-analog converter providing the first analog feedback signal according to the quantized output; and
   an active gain stage coupled with the passive delta sigma converter stage, the active gain stage receiving a system analog input and providing the converter stage analog input according to the system analog input and the quantized output, wherein the active gain stage comprises:
   a second filter receiving the system analog input and a second analog feedback-signal, the second filter being free of switching components;
   a second digital-to-analog converter coupled with the second filter and with the quantizer, the second digital-to-analog converter providing the second analog feedback signal according to the quantized output; and
   an amplifier coupled with the second filter;
   wherein the amplifier and the second filter provide the converter stage analog input according to a difference between the system analog input and the second analog feedback signal scaled by a gain factor, wherein the second filter is a second order low pass filter and the first filter is a second order low pass filter.

5. The system of claim 4, wherein poles of the second filter are substantially matched with poles of the first filter.

6. The system of claim 4, wherein the first digital-to-analog converter comprises at least one switched capacitor circuit.

7. An analog-to-digital converter system, comprising:
   a passive delta sigma converter stage comprising:
   a first filter receiving a converter stage analog input and a first analog feedback signal, the first filter being free of switching components and providing a first filtered analog signal according to the converter stage analog input and according to the first analog feedback signal,
   a quantizer coupled with the first filter, the quantizer providing a quantized output according to the first filtered analog signal, and a first digital-to-analog converter coupled with the first filter and with the quantizer, the first digital-to-analog converter providing the first analog feedback signal to the quantized output; and an active gain stage coupled with the passive delta sigma converter stage, the active gain stage receiving a system analog input and providing the converter stage analog input according to the system analog input and the quantized output, wherein the active gain stage comprises:

a second filter receiving the system analog input and a second analog feedback signal, the second filter being free of switching components;

a second digital-to-analog converter coupled with the second filter and with the quantizer, the second digital-to-analog converter providing the second analog feedback signal according to the quantized output; and an amplifier coupled with the second filter wherein the amplifier and the second filter provide the converter stage analog input according to a difference between the system analog input and the second analog feedback signal scaled by a gain factor, wherein the first and second digital-to-analog converters individually comprise at least one switched capacitor circuit.

8. The system of claim 7, wherein the active gain stage provides the converter stage analog input according to a difference between the system analog input and the quantized output scaled by a gain factor.

9. The system of claim 8, wherein the gain factor is about 25 or more.

10. The system of claim 9, wherein the gain factor is about 100.

11. The system of claim 7, wherein the first filter is a second order low pass filter.

12. A data converter system, comprising:
a passive circuit comprising:
a quantizer in a forward signal path, the quantizer providing a quantized output representative of a quantizer input signal, and
a passive filter coupled with the quantizer in the forward signal path, the passive filter being free of switching components and providing the quantizer input signal according to a converter input and a first feedback signal;
an active circuit coupled with the passive circuit, the active circuit comprising an active filter in the forward signal path, the active filter being free of switching components and providing the converter input according to a difference between a system analog input and a second feedback signal and according to a gain factor; and
a feedback circuit in a feedback signal path, the feedback circuit being coupled with the quantizer, the passive filter, and the active filter, the feedback circuit providing the first and second feedback signals according to the quantized output, wherein the passive and active filters are second order low pass filters.

13. The system of claim 12, wherein poles of the active filter are substantially matched with poles of the passive filter.

14. The system of claim 12, wherein the feedback circuit comprises at least one digital-to-analog converter providing one or more of the first and second feedback signals according to the quantized output.

15. A data converter system, comprising:
a passive circuit comprising:
a quantizer in a forward signal path, the quantizer providing a quantized output representative of a quantizer input signal, and
a passive filter coupled with the quantizer in the forward signal path, the passive filter being free of switching components and providing the quantizer input signal according to a converter input and a first feedback signal;
an active circuit coupled with the passive circuit, the active circuit comprising an active filter in the forward signal path, the active filter being free of switching components and providing the converter input according to a difference between a system analog input and a second feedback signal and according to a gain factor; and
a feedback circuit in a feedback signal path, the feedback circuit being coupled with the quantizer, the passive filter, and the active filter, the feedback circuit providing the first and second feedback signals according to the quantized output, wherein poles of the active filter are substantially matched with poles of the passive filter.

16. A data converter system, comprising:
a passive circuit comprising:
a quantizer in a forward signal path, the quantizer providing a quantized output representative of a quantizer input signal, and
a passive filter coupled with the quantizer in the forward signal path, the passive filter being free of switching components and providing the quantizer input signal according to a converter input and a first feedback signal;
an active circuit coupled with the passive circuit, the active circuit comprising an active filter in the forward signal path, the active filter being free of switching components and providing the converter input according to a difference between a system analog input and a second feedback signal and according to a gain factor; and
a feedback circuit in a feedback signal path, the feedback circuit being coupled with the quantizer, the passive filter, and the active filter, the feedback circuit providing the first and second feedback signals according to the quantized output, wherein the gain factor is about 25 or more.

17. The system of claim 16, wherein the gain factor is about 100.

18. A fourth order delta sigma analog-to-digital converter, comprising:
a passive delta sigma modulator comprising a passive filter, a quantizer, and a digital-to-analog converter in a first feedback loop; and
an amplifier in a second feedback loop around the passive delta-sigma modulator.

19. The converter of claim 18, further comprising a second filter in the second feedback loop.

20. The converter of claim 19, wherein the passive filter and the second filter are second order low pass filters.

21. The converter of claim 19, wherein poles of the passive filter are substantially matched with poles of the second filter.

22. The converter of claim 18, wherein a gain factor of the amplifier is about 25 or more.

23. The converter of claim 18, wherein a gain factor of the amplifier is about 100.

* * * * *